(12) United States Patent
Tutt

(10) Patent No.: US 7,074,047 B2
(45) Date of Patent: Jul. 11, 2006

(54) ZERO INSERTION FORCE HIGH FREQUENCY CONNECTOR

(75) Inventor: Christopher Alan Tutt, Londonderry, NH (US)

(73) Assignee: Tensolite Company, St. Augustine, FL (US)

( * ) Notice: Subject to any disclaimer, the term of this patent is extended or adjusted under 35 U.S.C. 154(b) by 0 days.

(21) Appl. No.: 10/702,192

(22) Filed: Nov. 5, 2003

(65) Prior Publication Data

US 2005/0095896 A1    May 5, 2005

(51) Int. Cl.
*H01R 12/00* (2006.01)
(52) U.S. Cl. ........................................ 439/66
(58) Field of Classification Search ............. 439/66, 439/63, 91, 581
See application file for complete search history.

(56) References Cited

U.S. PATENT DOCUMENTS

| | | | |
|---|---|---|---|
| 4,534,602 A | 8/1985 | Bley | 339/14 |
| 4,596,432 A | 6/1986 | Tighe, Jr. | |
| 4,653,840 A | 3/1987 | Grabbe et al. | |
| 4,692,561 A | 9/1987 | Nattel | 174/65 SS |
| 4,695,258 A | 9/1987 | Hanson et al. | 439/67 |
| 4,754,546 A * | 7/1988 | Lee et al. | 29/877 |
| 4,820,376 A | 4/1989 | Lambert et al. | 156/643 |
| 4,932,883 A | 6/1990 | Hsia et al. | 439/66 |
| 4,952,174 A | 8/1990 | Sucht et al. | |
| 5,045,249 A | 9/1991 | Jin et al. | 264/24 |
| 5,046,966 A | 9/1991 | Snyder et al. | |
| 5,123,851 A | 6/1992 | Young et al. | 439/67 |
| 5,148,135 A | 9/1992 | Stein | 333/246 |
| 5,163,836 A | 11/1992 | Young et al. | 439/67 |
| 5,274,917 A | 1/1994 | Corbett, III et al. | 29/860 |
| 5,373,109 A | 12/1994 | Argyrakis et al. | 174/117 FF |

(Continued)

FOREIGN PATENT DOCUMENTS

EP        0542102        2/1996

(Continued)

OTHER PUBLICATIONS

Daane, L and Greenstein, M, *A Demountable Interconnect System for a 50 × 50 Ultrasonic Imaging Transducer Array*, IEEE Transactions on Ultrasonics, Ferroelectrics and Frequency Control, Sep. 1997, pp. 978-982.

(Continued)

*Primary Examiner*—Phuong Dinh
(74) *Attorney, Agent, or Firm*—Wood, Herron & Evans, LLP

(57) ABSTRACT

A connector or connector assembly having a signal array having at least one shielded conductor having opposite ends and including an axial conductive element and an outer conductive element surrounding the axial conductive element and a compressible interface element positioned at least one of the opposite ends of the signal array, the interface element including a layer of insulating material having a plurality of conductive elements extending through the insulating material layer. When compressed between the signal array and a signal bearing component, the compressible interface element maintains the geometric arrangement of the axial conductive element and the outer conductive element to the signal bearing component.

A connector assembly may include a circuit board including land areas arranged in a shielded configuration, and corresponding to the shielded land areas on the component and a second compressible interface element. The compressible interface element is coupled between the circuit board and the shielded conductor to pass a signal from the shielded conductor to the land area on the second circuit board.

24 Claims, 5 Drawing Sheets

U.S. PATENT DOCUMENTS

| | | | |
|---|---|---|---|
| 5,380,212 | A | 1/1995 | Smeenge, Jr. et al. ........ 439/86 |
| 5,411,409 | A | 5/1995 | Gray et al. |
| 5,479,110 | A | 12/1995 | Crane et al. ................. 324/757 |
| 5,504,940 | A | 4/1996 | Hahs, Jr. et al. |
| 5,509,821 | A | 4/1996 | Small et al. |
| 5,609,501 | A | 3/1997 | McMills et al. |
| 5,701,233 | A | 12/1997 | Carson et al. ............... 361/735 |
| 5,795,162 | A * | 8/1998 | Lambert ...................... 439/63 |
| 5,857,865 | A | 1/1999 | Shimirak et al. |
| 5,872,550 | A | 2/1999 | Quan et al. |
| 5,904,580 | A | 5/1999 | Kozel et al. ................... 439/66 |
| 6,094,115 | A * | 7/2000 | Nguyen et al. ............. 333/260 |
| 6,183,272 | B1 | 2/2001 | Miller et al. .................. 439/91 |
| 6,241,532 | B1 | 6/2001 | Howell ........................ 439/67 |
| 6,348,659 | B1 | 2/2002 | Crotzer et al. ............. 174/68.1 |
| 6,358,615 | B1 | 3/2002 | Imai ........................... 428/447 |
| 6,380,485 | B1 | 4/2002 | Beaman et al. ............... 174/88 |
| 6,541,867 | B1 | 4/2003 | Fjelstad ...................... 257/773 |
| 6,590,478 | B1 * | 7/2003 | Pluymers .................... 333/246 |
| 6,685,487 | B1 | 2/2004 | Ward et al. |
| 6,712,620 | B1 | 3/2004 | Li et al. |
| 6,716,062 | B1 | 4/2004 | Palinkas et al. |
| 6,752,639 | B1 | 6/2004 | Kirkman et al. |
| 6,767,248 | B1 | 7/2004 | Hung |
| 6,822,162 | B1 | 11/2004 | Valentine et al. |
| 6,835,071 | B1 | 12/2004 | Pupkiewicz et al. |
| 6,843,657 | B1 * | 1/2005 | Driscoll et al. ............... 439/65 |
| 6,864,696 | B1 | 3/2005 | Logelin et al. |
| 2003/0199181 | A1 | 10/2003 | Chou et al. |
| 2003/0234165 | A1 | 12/2003 | Heller |
| 2004/0266384 | A1 | 12/2004 | Davis |
| 2005/0062492 | A1 | 3/2005 | Beaman et al. |
| 2005/0070144 | A1 | 3/2005 | Hall |

FOREIGN PATENT DOCUMENTS

| | | |
|---|---|---|
| EP | 0798802 | 10/1997 |
| EP | 1083355 | 1/2003 |

OTHER PUBLICATIONS

Ivanov, SA and Peshlov, V, *Vertical Transition with Elastomeric Connectors*, Ivanov, S.A. and Peshlov, V.: 14th International Conference on Microwaves, Radar and Wireless Communications. MIKON-2002. vol. 2, May 20-22, 2002, pp. 472-475.

Maurer, DJ, *Elastomeric Connectors in a New Role*, Sensors, vol. 15, No. 2, 1998, pp. 55-57.

International Search Report, Mailed Mar. 24, 2005.

* cited by examiner

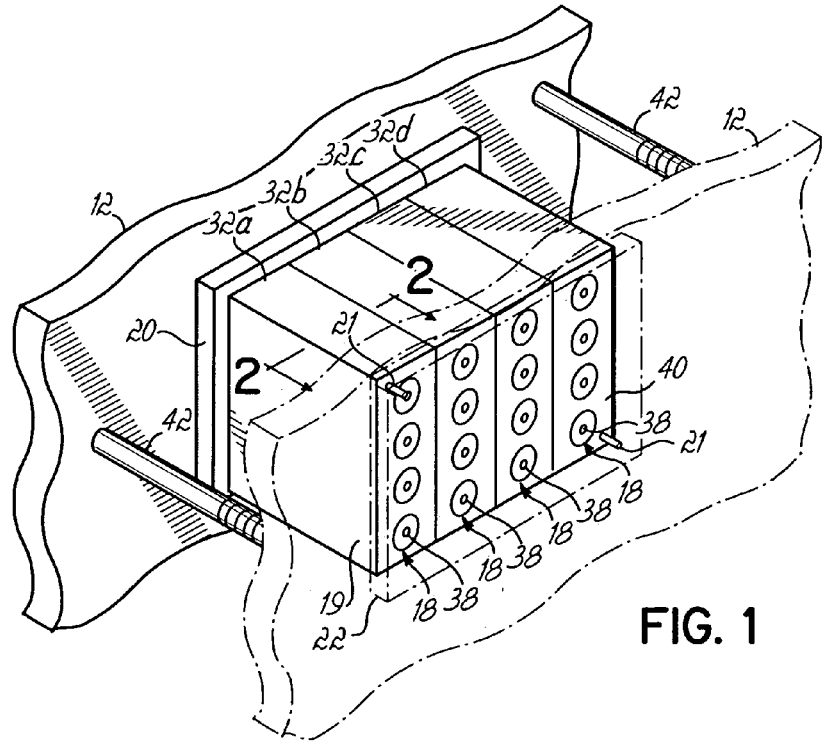
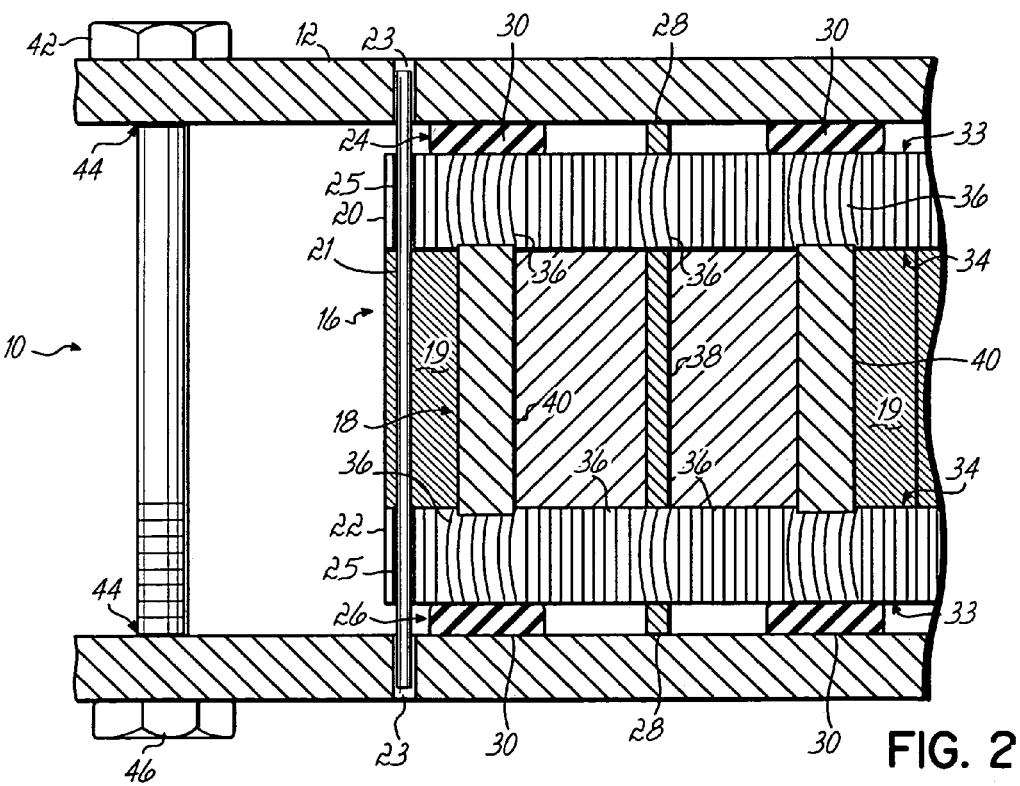
FIG. 1
FIG. 2

ZERO INSERTION FORCE HIGH FREQUENCY CONNECTOR

FIELD OF THE INVENTION

This present invention relates generally to electrical connectors, such as those used to electrically couple two circuit boards together and particularly to improving the performance, construction and ease of use of such electrical connectors.

BACKGROUND OF THE INVENTION

The use of electronic products of all kinds has increased dramatically throughout society, which has led to a significant increase in the demand for improved components utilized within such products. One facet in the utilization of such electronic products involves the coupling of high frequency signals, e.g., data and/or communications signals, between various electronic circuit boards contained within such products.

Some electronic products include a rack or frame into which multiple circuit packs are inserted. Generally, a frame includes a circuit board referred to as a "backplane", while a circuit pack may include one or more circuit boards. A backplane generally includes multiple connectors soldered to and interconnected by conductive traces. A backplane typically provides little functionality other than electrically interconnecting the circuit boards within the circuit packs. A backplane however may also provide electrical connections external to the frame. When a backplane includes functionality, it may be referred to as a "motherboard". Such is the case, for example, in a personal computer (PC).

Since backplanes are sometimes referred to as motherboards, the circuit packs containing circuit boards that are electrically interconnected using such a motherboard backplane are often referred to as daughter cards. Each daughter card includes one or more circuit boards having electrically conductive traces to electrically interconnect various electrical components in a circuit. Electrical components, such as integrated circuits (ICs), transistors, diodes, capacitors, inductors, resistors, etc., may be packaged with metallic leads that are soldered to conductive traces on a daughter card. A daughter card will typically include a connector, proximate an edge, and soldered to the traces, for electrically coupling to a corresponding connector on the motherboard backplane when inserted into the frame.

One common method of attaching electrical components to a circuit board is to include "through holes", e.g., holes drilled through the circuit board, and land areas in the traces proximate the holes. Wire leads on the electrical components may then be bent or "formed" or configured for insertion through the holes, and soldered to the land areas once inserted, or "placed".

Readily available through hole male and female connectors, such as GbX™, VHDM-HSD™, VHDM®, Hardmetric (HM), CompactPCI, etc. from manufacturers such as Amphenol, Teradyne, Tyco, etc. are often used for interconnecting two circuit boards. Such connectors are available in various sizes, having various arrays of conductive contact pins. Such arrays of pins are generally held together using a dielectric material, forming the connector. Each pin includes a portion extending from the dielectric material that may be inserted into a through hole in a circuit board. A circuit board for use with a respective connector will have through holes corresponding to the pins of the connector. Conductive traces on the circuit board extend from the land areas corresponding to the pins forming nodes in a circuit.

In production, a circuit board is often placed on a conveyer. As the conveyer moves the board, a solder paste is applied to the board. Through hole electronic components, including connectors, are typically hand placed in the corresponding through holes, the solder paste having been applied. The conveyer then carries the board and connector through an oven that heats the solder paste, soldering the connector to the board. Such a process is generally referred to as "wave soldering".

Another common method of attaching electrical components to a circuit board is referred to as "surface mounting". In surface mounting, land areas are also included in the traces, but holes through the circuit board are not necessary. In the case of a surface mount connector, rather than each pin including a portion that may be inserted into a through hole in a circuit board, each pin will include an electrically conductive "foot". A surface mount connector with conductive feet may be slid over and/or bolted to the edge of a circuit board, the feet corresponding to land areas in the traces on the circuit board. Likewise, in production, surface mount connectors may also be wave soldered.

Irrespective of whether one of these connectors is a through hole or surface mount type, each type suffers from common problems once attached to a circuit board. For example, the pins typically found in these connectors are quite fine, or small. Any deviation in alignment when plugging one connector into another can result in the bending of one or more of these pins. This generally causes either a failure of the product under production test, or worse, a failure of the product in the possession of a user or consumer.

When a pin of a connector is bent, the connector must be removed from the board and a new connector installed. This is can be a difficult process, and at the very least, is a time consuming one. In the case of a surface mount connector, each of the conductive feet must heated one at a time and bent away from its respective land area to remove the connector. Alternatively, all of the conductive feet must be heated simultaneously to re-flow the solder, allowing the connector to be removed from the board. Typically, a hot air gun used for such heating. This subjects the board, as well other components adjacent to the connector, to a substantial amount of heat. A heat gun in the hands of an inexperienced repair technician can result in the board being ruined, or the adjacent components being damaged. Even when a heat gun is not used, replacement of a surface mount connector can take a considerable amount of time, and still requires a skilled technician.

In the case of a through hole connector, a heat gun also generally must be used. Through hole connectors typically require even more heat to be applied to a board for removal than surface mount connectors. Again, this makes removal difficult, increasing the chances for an unskilled technician to damage the board or surrounding components. In some cases, with connectors having a large array of pins, it becomes impractical, if not impossible, to simultaneously re-flow the solder on every pin. In such cases, the board must scrapped.

Another problem inherent in the afore described connectors is that the geometric arrangement and/or spacing between pins is not maintained through the connector to the surface of a respective circuit board. For example, pins in such connectors are generally used in pairs, a pair of pins carrying either a single ended or differential data and/or communications signal. Deviation in the geometric arrangement and/or spacing of between pins when used as a pair generally results in impedance variation with a change in frequency, thereby degrading the electrical performance of the connector and/or limiting the usable frequency range of the connector. Further, since these pins are arranged in an array, and pairs of pins are generally in close proximity to other pairs of pins, there can be, and often is electromagnetic interaction between pairs and/or pins. Such interaction is typically referred to as "crosstalk". Ideally, these pins would be consistently spaced throughout, and the connectors would provide some sort of shielding of the pairs to prevent crosstalk. Such connectors provide no shielding, nor is consistent spacing possible. Therefore, there is a need in the prior art to improve upon the connectivity between circuit board and respective motherboards. There is specifically a need to address the problems with such connectors when used with boards handling high speed data and other communications signals.

One type of connectors used for electrically coupling an electrical component to a circuit board is an elastomeric connector. Generally, an elastomeric connector comprises a body constructed of an elastic polymer material having opposing first and second faces and a plurality of fine conductors that are passed from the first to the second faces. An elastomeric connector may be positioned between land areas on a circuit board and conductive leads on the component, aligning the leads with the land areas. Pressure is then applied to the connector to compress the elastic polymer, providing electrical connection from the land areas on a circuit board on one face through the conductors to leads of the component on the other face. One example of the use of such an elastomeric connector is in electrically coupling a liquid crystal display (LCD) screen to a circuit board in a calculator. However, signals between an LCD screen and a circuit board are low frequency digital signals not high frequency data/communications signals. Therefore, there is little concern for the geometric arrangement of the components or shielding. Thus, elastomeric connectors are essentially often just parallel data and/or power lines.

There have been other uses of elastomeric materials, such as in test fixtures to electrically contact integrated circuit chips in production testing, to couple a ribbon cable to a circuit board, or in coupling a pin grid array to a circuit board. However, again the elastomeric connectors when so used are generally parallel data and/or power lines. Yet another use of an elastomeric material has been in the form of a seal in a connector to thereby extend the shielding provided by an outer conductor in a data cable. Therefore, elastomeric connectors, to date, are essentially for power transfer or simple low frequency digital signal transfer or shielding. Therefore, such connectors have not been particularly suited to the transfer of high frequency signals, e.g., data and/or communications signals in a connector assembly between two circuit boards.

It is desirable to address drawbacks in the prior art in providing high frequency data and/or communications connections between electrical circuit boards.

Furthermore, it is desirable to maintain the geometric arrangement and alignment of conductors in a connector.

Additionally, it is desirable to improve the replacement and serviceability of a high speed data connector assembly.

It is further desirable to provide multiple such connections in a compact arrangement, such as an array, that are shielded.

These objectives and other objectives will become more readily apparent from the summary of invention and detailed description of embodiments of the invention set forth herein below.

SUMMARY OF THE INVENTION

The present invention addresses the above drawbacks and provides the benefits of an elastomeric connector, while providing high frequency data and/or communications connections between two electrical circuit boards or other components. To this end, and in accordance with principles of the present invention, a connector assembly includes a circuit board or component having at least one shielded land area and a signal array including at least one shielded conductor having at least one central conductive core and a conductive outer structure. A connector of insulating material with two faces and conductive elements extending from face to face is coupled between the circuit board/component and the shielded conductor of the array to pass a high speed data and/or communications signal from the shielded conductor to the land areas of the circuit board/component.

The connector assembly of the invention maintains the geometric arrangement of the shielded conductor through the connector to the land areas. The connector assembly is also easily replaced requiring no soldering and is, therefore, easily and readily serviceable.

In one embodiment of the invention, a signal array and two elastomeric connectors are placed between two substantially parallel circuit boards to electrically pass high frequency data and/or communications signals between the circuit boards.

In another embodiment of the invention, a signal array and two elastomeric connectors are placed between two substantially orthogonal circuit boards.

In another embodiment of the present invention, a signal array comprises at least one coaxial conductor including a central conductive core and a conductive outer structure.

In yet another embodiment of the present invention, a signal array comprises at least one twin axial conductor including two central conductive cores and a conductive outer structure.

These features and other features of the invention will become more readily apparent from the Detailed Description and drawings of the application.

BRIEF DESCRIPTION OF THE DRAWINGS

The accompanying drawings, which are incorporated in and constitute a part of this specification, illustrate embodiments of the invention and, together with a general description of the invention given below, serve to explain the principles of the invention.

FIG. 1 is a perspective view of an embodiment of a connector assembly between two substantially parallel components, such as circuit boards, having coaxial land areas, one of the boards is shown in phantom lines, in accordance with principles of the present invention, and illustrating features thereof. Although circuit boards are used to illustrate some embodiments of the invention, the present invention also has applicability to other components as well.

FIG. 2 is a partial cross-sectional view of the connector assembly of FIG. 1 along line 2—2 of FIG. 1.

DETAILED DESCRIPTION OF THE INVENTION

Figure 3:
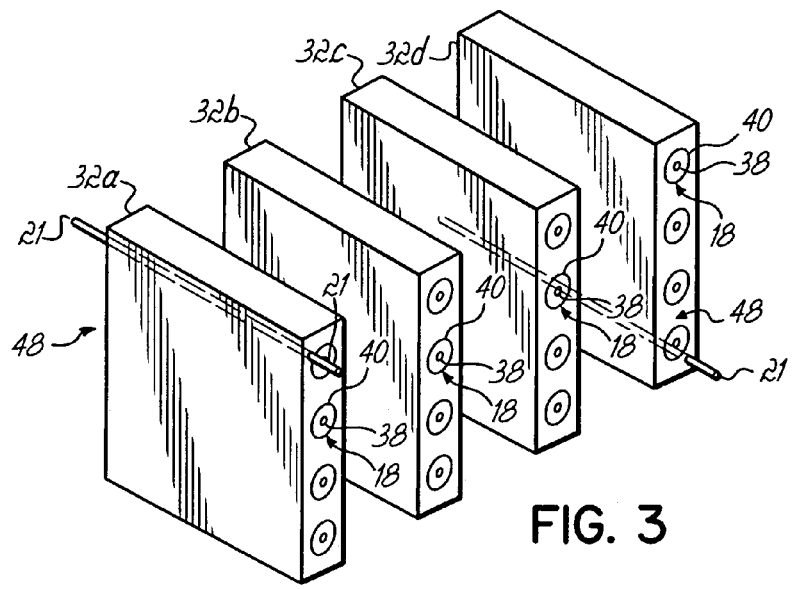
FIG. 3 is an exploded view of the signal array shown in FIGS. 1 and 2.

Referring to FIGS. 1 and 2, connector assembly 10 comprises two substantially parallel oriented components, such as circuit boards 12, 14 (circuit board 14 shown in phantom line), a signal array 16 including at least one shielded conductor 18, and compressible interface elements 20, 22 (compressible interface element 22 also shown in phantom line) coupled between each circuit board 12, 14 and shielded conductor 18. Circuit boards 12, 14 include corresponding shielded land areas 24, 26, only shielded land area 26 being shown in FIG. 1. Shielded conductor 18 has opposite ends and includes an axial conductive element 38 and an outer conductive element 40 surrounding the axial conductive element 38. Shielded land areas 24, 26 include a central conductive core area 28 and a conductive outer structure area 30. Land areas 24, 26 on circuit boards 12, 14 may be etched, deposited, or other placed using methods well known to those of skill in the art.

Although not shown for ease of illustration, those of skill in the art will appreciate that central conductive core areas 28 and conductive outer structure areas 30 extend to traces on multiple layers of circuit boards 12, 14, and, in some instances, to electrical components, e.g., integrated circuits (ICs), transistors, diodes, capacitors, inductors, resistors, etc., soldered to those traces. Such traces, in part, form nodes in circuits on circuit boards 12, 14. The construction of and uses for circuit boards including traces on multiple layers are well known to those of skill in the art.

For example, circuit boards 12, 14 may be a backplane and a circuit pack. Circuit boards 12, 14 may be two circuit boards comprising a circuit pack. Circuit boards 12, 14 may also be a motherboard and a daughter card. Other applications wherein two substantially parallel circuit boards are desired will readily appear to those of skill in the art.

Again, a signal array, such as signal array 16, comprises one or more blocks or wafers 32, each including one or more shielded conductors 18. Each shielded conductor 18 includes an axial conductive element 38 and an outer conductive element 40 surrounding the axial conductive element 38, as may be seen in FIG. 2.

Shielded conductors are generally used for high speed or high frequency signals, such as high speed data and/or communications signals. Signals as defined herein mean essentially conducted voltages and/or currents associated with conductors and not necessarily "smart" signals. Further, the simultaneous conduction of voltages and/or currents create a data signal or other signal.

Desirable attributes of shielded conductors worthy of particular note are minimizing interference and constant impedance. For example, the outer conductive element or shield of a shielded conductor is generally connected to a reference or electrically grounded. Thus, other shielded conductors likewise having grounded shields will generally be resistant to interference by the signals carried by the adjacent shielded conductors. Such coupling or interfering of signals between proximate conductors may also be referred to as "crosstalk". The lack of "crosstalk" between shielded conductors is generally due to there being no voltage gradient between the various shields due to each of the shields being grounded or connected to the same or similar reference or voltage potential.

Further, shielded conductors are commonly available in two types, though others may be possible. One type is coaxial, or coax, and another type twinaxial, or twinax. Coaxial conductors generally have a central conductive core or center conductor equally spaced or centered axially within a shield or outer conductive structure. An outer conductive structure may be braided wires or a conductive foil, or some combination thereof, or some rigid or semi-rigid adequately conductive metal.

Similarly, twinaxial conductors generally have two central conductive cores or center conductors spaced apart or twisted and equally spaced or centered axially, within a shield or outer conductive structure. Thus, both types have an axial conductive element and an outer conductive structure surrounding the axial conductive element, an axial conductive element being defined herein as a conductive element located or spaced axially within an outer conductive element.

In use, the center conductor of a coaxial conductor generally carries a signal that varies with respect to the shield, which is generally grounded as mentioned above. Such a signal may be referred to "single-ended," in that only the center conductor carries a signal that varies with respect to ground. In contrast, a twinaxial conductor has two center conductors that carry signals that are the same, but 180 degrees out of phase. The advantage in a twinaxial conductor is that any interference that is induced or coupled into the center conductors of the twinaxial conductor past the shield may be cancelled when the two out of phase signals are added together. Thus, the signal is formed by the difference between the two out of phase signals carried by the center conductors, such a signal being referred to "differential."

If the signals carried by the center conductors of a coaxial or twinaxial conductor are low speed or low frequency, the spacing between the center conductors and the shield is of little consequence. However, as the speed or frequency of the signals carried by center conductors is increased, the spacing between the center conductors and the shield becomes significant. For example, with high speed data and/or communications signals, the spacing between the center conductors and the shield, along with the center conductors and the shield themselves, form a capacitor of significant value. Such capacitance in a shielded conductor is often referred as a "distributed capacitance," as the capacitance is distributed along the length of the conductor, and may be described in units of picofarads per foot (pF/ft).

Moreover, the overall size or dimensions of a shielded conductor, along with the spacing, determines a characteristic impedance for the conductor at particular frequency ranges of use. For example, common impedances for coaxial and twinaxial cables are 50, 75, 100, and 110 ohms. Such characteristic impedances are of particular importance in designing a high frequency circuit for maximum power transfer between a source and a load.

The present invention addresses both interference and constant impedance, as well as other things, in providing connectors and/or connector assemblies for use with high speed data and/or communications signals.

For example, and as shown in FIG. 1, signal array 16 includes four blocks 32, each containing four shielded conductors 18, that are used to form a four-by-four array. Those skilled in the art will appreciate that any number of blocks having any number of shielded conductors may be used to form an array of any size desired, and that a variation in the size of an array does not constitute a departure form the spirit of the present invention. Signal array 16 will be discussed in more detail in conjunction with FIG. 3.

Referring now to FIG. 2, a partial cross-sectional view of connector assembly 10 taken along line 2—2 of FIG. 1 is shown. Generally, FIG. 2 shows a cross-sectional view through one of the shielded conductors 18 in signal array 16, along with the coupling of that conductor to the circuit boards 12, 14. Again, each shielded conductor 18 includes an axial conductive element 38 and an outer conductive element 40. Each shielded conductor 18 is molded or potted in a non-conductive substance, such as a liquid crystal polymer (LCP) material 19. Molding the shielded conductor 18 into LCP material 19 allows positioning of the ends of the conductor to tight tolerances typically found with such molding. Additional details concerning such molding will be discussed herein after. Those skilled in the art will appreciate that the expansion of the cross-sectional view to include other conductors in the array would be redundant in nature; and therefore, such an expansion is not made for ease of illustration and purposes of clarity.

Compressible interface elements 20, 22 each include two faces 33, 34 and conductive elements 36 (not shown in FIG. 1; but, shown in FIG. 2) extending from face 32 to face 34. Compressible interface elements 20, 22 are generally constructed of an elastomeric material, e.g., elastomeric connectors. The elastomeric connectors comprises a body constructed of an elastic polymer having opposing first and second faces, e.g., faces 33 and 34 shown in FIG. 2, and a plurality of fine conductors, e.g., conductive elements 36, also shown in FIG. 2, that pass or extend from the first to the second faces.

Elastomeric connectors may be constructed using extremely accurate silicon rubber with anisotropic conductive properties. Such connectors may include anywhere from 300 to 2,000 fine metal wires per square centimeter embedded in the thickness direction of a transparent silicone rubber sheet. Such fine metal wires are generally gold-plated to ensure low resistivity and the ability to withstand relatively high current flow.

In use, compressible interface elements 20, 22 are placed between corresponding shielded land areas 24, 26 on circuit boards 12, 14 and shielded conductors 18 in signal array 16, aligning the central conductive core areas 28 and the conductive outer structure areas 30 with the axial conductive element 38 and the outer conductive element 40, respectively. Guide pins or posts 21 also molded into LCP material 19, corresponding to holes 23 in circuit boards 12, 14 and holes 25 in compressible interface elements 20, 22 are configured to aid in, or provide, such alignment. Those of ordinary skill in the art will appreciate that other structures such as notches, raise portions or bumps and corresponding recessed portions, etc. may be used in the alternative to aid in or provide alignment.

Pressure is then applied to compressible interface elements 20, 22 to compress the elements 20, 22 such that the conductive elements 36 provide electrical connection from shielded land areas 24, 26 on circuit boards 12, 14 on faces 32 through elements 36 to shielded conductor 18 on faces 34. Such pressure or compression typically causes those conductive elements making such contacts to distort or bend as shown, whereas those conductive elements that do not make such contacts generally remain straight.

It will be appreciated that holes 25 in compressible interface elements 20, 22 are not necessary for alignment of compressible interface elements 20, 22. To function adequately, compressible interface elements 20, 22 only need cover shielded land areas 24, 26 and the ends of shielded conductors 18, as aligned. Which conductive elements 36 within compressible interface elements 20, 22 make contact with or electrically couple the shielded land areas 24, 26 and the ends of shielded conductors 18 is irrelevant. Rather, holes 25 in compressible interface elements 20, 22 merely serve to hold compressible interface elements 20, 22 in place as connector assembly 10 is assembled.

However, proper alignment of corresponding shielded land areas 24, 26 on circuit boards 12, 14 and shielded conductors 18 in signal array 16, is necessary to electrically couple the circuit boards. Moreover, and with respect to each shielded conductor 18, the compressible interface elements 20, 22, when compressed between the signal array 16 and a signal bearing component, such as circuit boards 12, 14, maintains the geometric arrangement of the axial conductive element 38 and the outer conductive element 40 through the compressible interface elements 20, 22 to the signal bearing component, or circuit boards 12, 14. Further, those conductive elements 36 under pressure and contacting the central conductive core areas 28 and the conductive outer structure areas 30 with the axial conductive element 38 and the outer conductive element 40, respectively, form, in effect, a solid center conductor and a solid surrounding outer shield due to the density of the conductive elements 36 in compressible interface elements 20, 22. Still further, when compressible interface elements 20, 22 are compressed, the shielding of each shielded conductor 18 is extended, and in effect, the compressible interface connectors take on the shielding arrangement of the shielded conductors 18 in blocks 32a–d.

Pressure may be applied using a variety of fasteners. For example, and as shown in FIG. 1, bolts 42 extending through corresponding holes 44 in circuit boards 12, 14 with nuts 46 may be used to compress, or apply pressure to, compressible interface elements 20, 22 coupled between circuit boards 12, 14 and signal array 16. Other fasteners including, but not limited to, bolts, screws, threaded inserts, tapped portions, etc. may used in the alternative.

Referring now to FIG. 3, an exploded view of signal array 16 shown in FIGS. 1 and 2 is illustrated. Signal array 16 of the illustrated embodiment comprises four blocks 32a–d, each including four shielded conductors 18. A greater or lesser number of blocks or a greater or lesser number of shielded conductors 18 per block might also be used. Each shielded conductor 18 includes an axial conductive element 38 and an outer conductive element 40. For example, shielded conductors 18 may be semi-rigid coax well known to those of skill in the art.

Each block 32a–d may be constructed by molding or potting shielded conductors 18, such as, for example, lengths of semi-rigid coax, in a non-conductive substance, such as a LCP material 19, as mentioned above. The contact faces 48 of the blocks 32a–d may then be machined or polished to improve the co-planarity of the shielded conductors 18 or semi-rigid coax on the contact faces 48. Such machining or polishing improves the interface between signal array 16 and compressible interface elements 20, 22. Guide pins or posts 21 may likewise be molded into one or more blocks 38a–d. For example, and as shown in FIG. 3, guide posts 21 are molded into blocks 38a and 38d.

Shielded conductors 18 accompanied by compressible interface elements 20, 22 that extended the shielding of the shielded conductors 18 may be used for single-ended signals, such as high speed data and/or communications signals. Shielding is particularly useful in preventing interference when using such high speed signals. Moreover, shielding prevents "crosstalk" between shielded conductors placed in close proximity with one another, and facilitates the construction of dense or tightly spaced arrays of shielded conductors.

In addition, connector assembly 10 includes elastometic connector elements, e.g., compressible interface elements 20, 22, in providing high frequency data and/or communications connections between circuit boards 12 and 14. In doing so, connector assembly 10 requires no soldering. Further, no soldering or special skill is required to remove and replace one of the compressible interface element 20, 22 or the signal array 16. A user need only remove the fasteners 42, 46, reposition new compressible interface elements, and/or a new signal array, and, with the aid of guide posts 21, reinstall the fasteners 42, 44. Moreover, connector assembly 10 includes no pins that may be bent or broken in assembly, resulting in a failure of the product the circuit boards 12, 14 are included in, either under production test or in the possession of a user or consumer. Also, connector assembly 10 extends the geometric arrangement of the shielded conductors 18 in the signal array 16 through the connector assembly 10 to the surface of the circuit boards 12, 14. By extending the geometric arrangement, with its inherent shielding, crosstalk between shielded conductors in the array is reduced, while the variation in impedance with changes in frequency of each respective shielded conductor 18 is also reduced. Thus, connector assembly 10 improves the replacement and serviceability of high speed data and/or communications connections.

Figure 4:
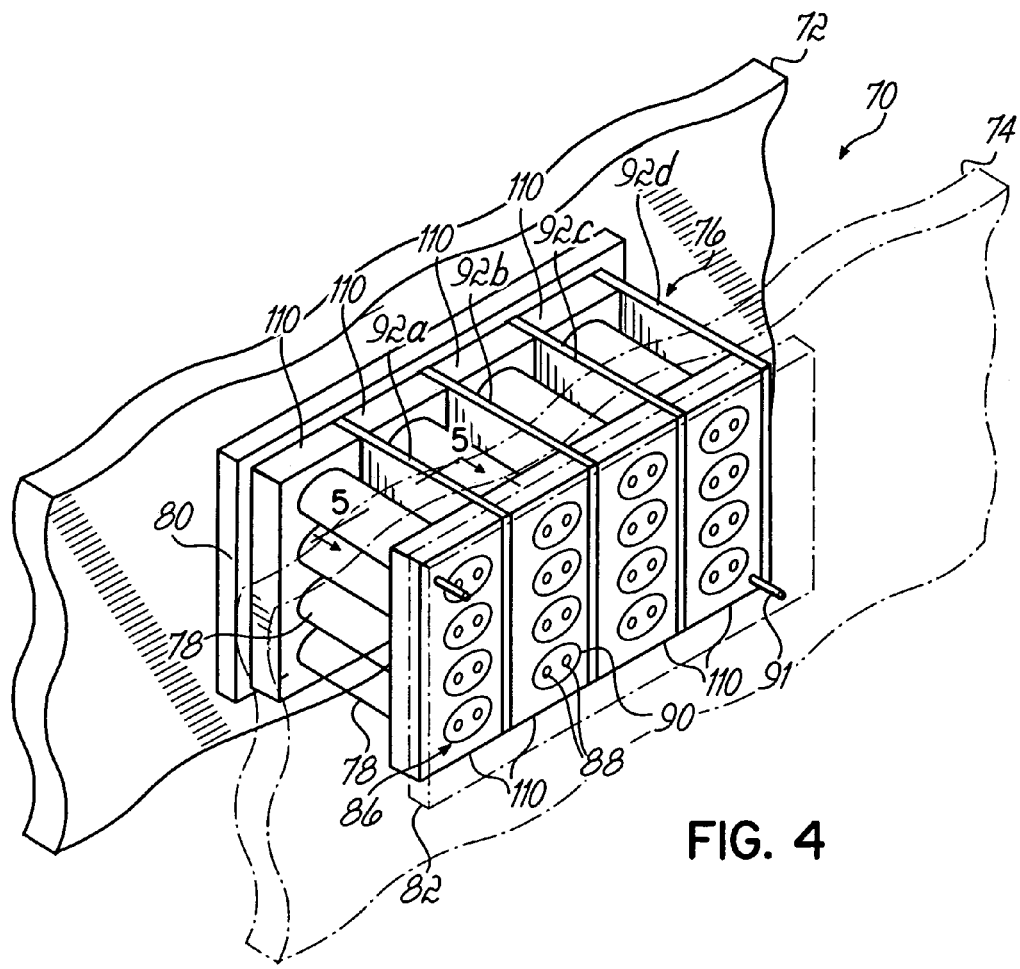
FIG. 4 is a perspective view of an embodiment of a connector assembly between two substantially parallel circuit boards having twin axial land areas, one of the boards shown in phantom lines, in accordance with principles of the present invention.
Figure 5:
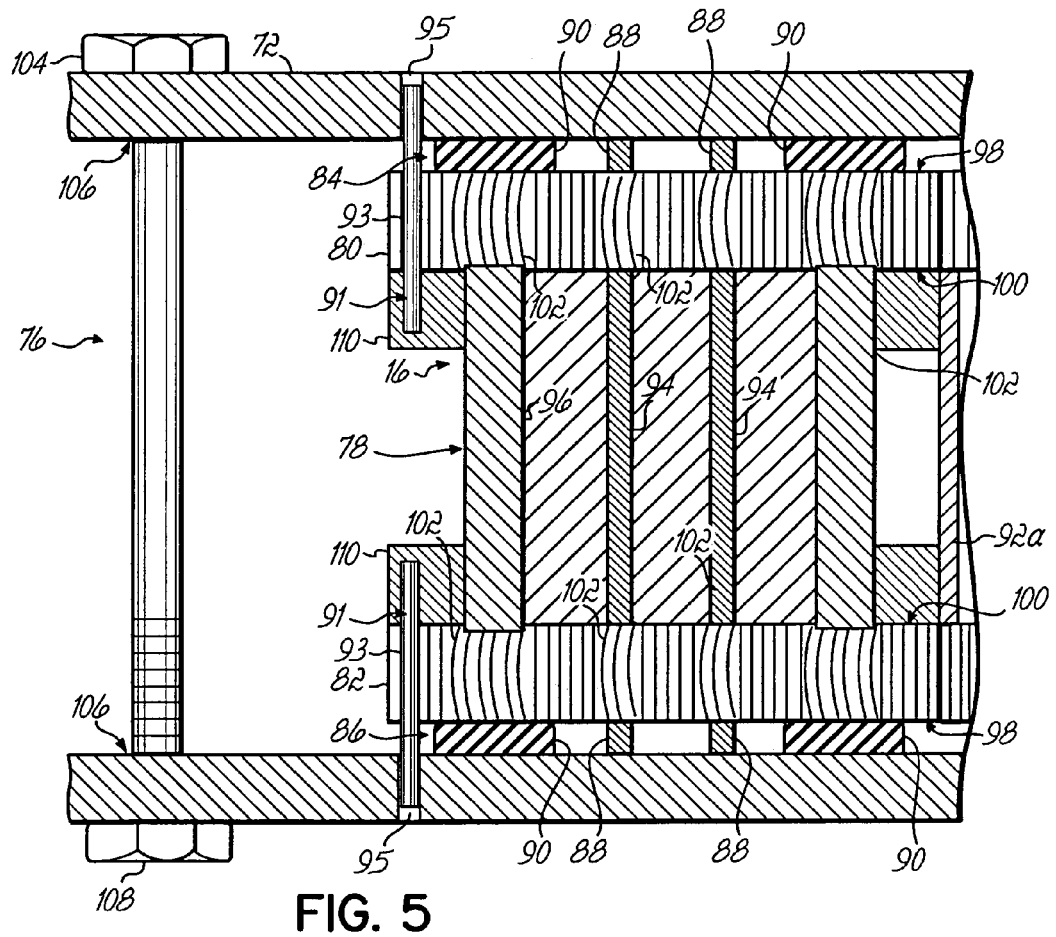
FIG. 5 is a partial cross-sectional view of the connector assembly of FIG. 4 along line 5—5 of FIG. 4.

The invention is also useful in a twinaxial arrangement. Referring now to FIGS. 4 and 5, connector assembly 70 comprises two substantially parallel circuit boards 72, 74 (circuit board 74 shown in phantom line), a signal array 76 including at least one shielded conductor 78, and compressible interface elements 80, 82 (element 82 also shown in phantom line) coupled between each circuit board 72, 74 and shielded conductor 78. Circuit boards 72, 74 include at least one pair of corresponding shielded land areas 84, 86, only shielded land area 86 being shown in FIG. 4. Shielded land areas 84, 86 include two central conductive core areas 88 and a conductive outer structure area 90.

Although not shown, those of skill in the art will appreciate that central conductive core areas 88 and conductive outer structure areas 90 extend to traces on multiple layers of circuit boards 72, 74. Such traces form nodes in circuits on circuit boards 72, 74, the construction of and uses for circuit boards including traces on multiple layers being well known to those of skill in the art. For example, circuit boards 72, 74 may be a backplane and a circuit pack, two circuit boards comprising a circuit pack, or a motherboard and a daughter card. Other applications of two such circuit boards will readily appear to those of skill in the art.

Signal array 76, comprises four (or more or less) wafers 92a–d, each containing four (or more or less) shielded conductors 78. Each shielded conductor 78 includes two axial conductive elements 94 and a conductive outer element 96, as may be seen in FIG. 5. Signal array 76 will be discussed in more detail in conjunction with FIG. 6.

Referring now to FIG. 5, a partial cross-sectional view of connector assembly 70 taken along line 5—5 of FIG. 4 is shown. More specifically, FIG. 5 shows a cross-sectional view through one of the shielded conductors 78 in wafer 92a in signal array 76, along with the coupling of the shielded conductor 78 to circuit boards 72, 74.

Compressible interface elements 80, 82 each include two faces 98, 100 and conductive elements 102 that extend from face 98 to face 100, and are constructed of an elastomeric material. Thus, compressible interface elements 80, 82 may be referred to as elastomeric connectors and may be similar to those previously described above as elements 20, 22.

Compressible interface elements 80, 82 are placed between corresponding shielded land areas 84, 86 on circuit boards 72, 74 and shielded conductors 86 in signal array 76, aligning the central conductive core areas 88 and the conductive outer structure areas 90 with the two axial conductive elements 94 and the conductive outer element 96, respectively. For example, FIG. 5 shows such an alignment. Guide posts 91 molded into mounting ends 110 and extending through holes 93 in compressible interface elements 80, 82 and holes 95 in circuit boards 72, 74 aid in such alignment while holding compressible interface elements 80, 82 in position during assembly of connector assembly 70.

Pressure is applied to compressible interface elements 80, 82 such that conductive elements 102 provide electrical connections from shielded land areas 84, 86 on circuit boards 72, 74 on faces 98 through elements 102 to shielded conductors 78 on faces 100. Such pressure causes those conductive elements making such contacts to distort or bend slightly as illustrated. Pressure may be applied using bolts 104 extending through corresponding holes 106 in circuit boards 72, 74 with nuts 108, as shown. Such bolts 104 may also aid in alignment in some embodiments. Other fasteners may used in the alternative without departing from the spirit of the present invention.

When compressible interface elements 80, 82 are compressed as illustrated, conductive elements 102 contacting conductive outer element 96 and conductive outer structure areas 90 form a shield around, or "shield", those conductive elements 102 contacting axial conductive elements 94 and central conductive core areas 88. Thus, under pressure, conductive elements 102 of compressible interface elements 80, 82 "extend" the geometric arrangement or shielding of shielded conductors 78 through to land areas 84, 86, or the surface, of circuit boards 72, 74.

Figure 6:
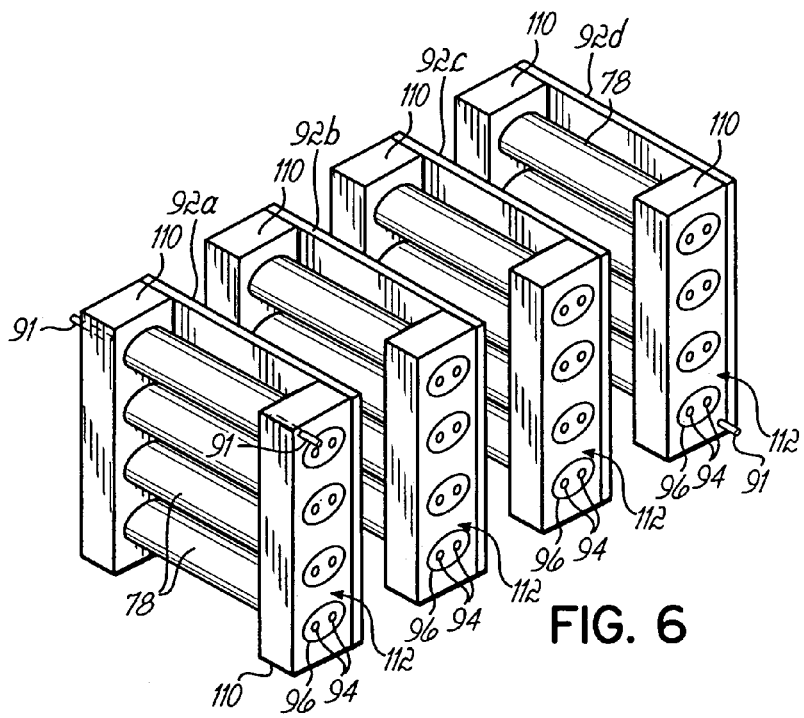
FIG. 6 is an exploded view of the signal array shown in FIGS. 4 and 5.

Referring now to FIG. 6, an exploded view of signal array 76 shown in FIGS. 4 and 5 is illustrated. Signal array 76 comprises four (or more or less) wafers 92a–d. Each wafer 92a–d comprises four (or more or less) twinaxial conductors 78 and two mounting ends 110. Each twinaxial conductor includes two central conductive cores 94 and a conductive outer element 96.

Each wafer 92a–d may be constructed using circuit board materials well know to those of skill in the art, such as fiberglass, epoxy, teflon, etc. Coupled to each wafer 92a–d are mounting ends 110. Mounting ends 110 may be constructed of a non-conductive substance, such as a LCP, and molded or formed to receive shielded conductors 78. Shielded conductors 78 may be lengths of semi-rigid twinax well known to those of ordinary skill in the art. The contact faces 112 of mounting ends 110 and shielded conductors 78 may be machined or polished to improve the co-planarity of the shielded 78 on the contact faces 112. Such machining improves the interface between signal array 76 and compressible interface elements 80, 82.

Shielded conductors 78 accompanied by compressible interface elements 80, 82 that extend the shielding of the shielded conductors may be used for differential signals, such high speed data and/or communications signals. Shielding is particularly useful in preventing interference when using such high speed signals, while two axial conductive elements conducting a differential signal is useful in cancelling any noise or interference that penetrates the shielding. Moreover, shielding prevents "crosstalk" between shielded conductors placed in close proximity with one another, and facilities the construction of tightly spaced arrays.

Connector assembly 70 also capitalizes on the benefits of elastomeric connectors, e.g., compressible interface elements 80, 82, in providing high frequency data and/or communications connections between circuit boards 72, 74. In doing so, connector assembly 70 requires no soldering. Also, no soldering or special skill is required to remove and replace one of the compressible interface elements 80, 82 or signal array 76. A user need only remove the fasteners, reposition the new interface elements and/or signal array, and reinstall the fasteners. Connector assembly 70 also improves the replacement and serviceability of high speed data and/or communications connections. There are also no pins to bend or break in the connector, and "crosstalk" qualities are improved at the connector assembly.

Figure 7:
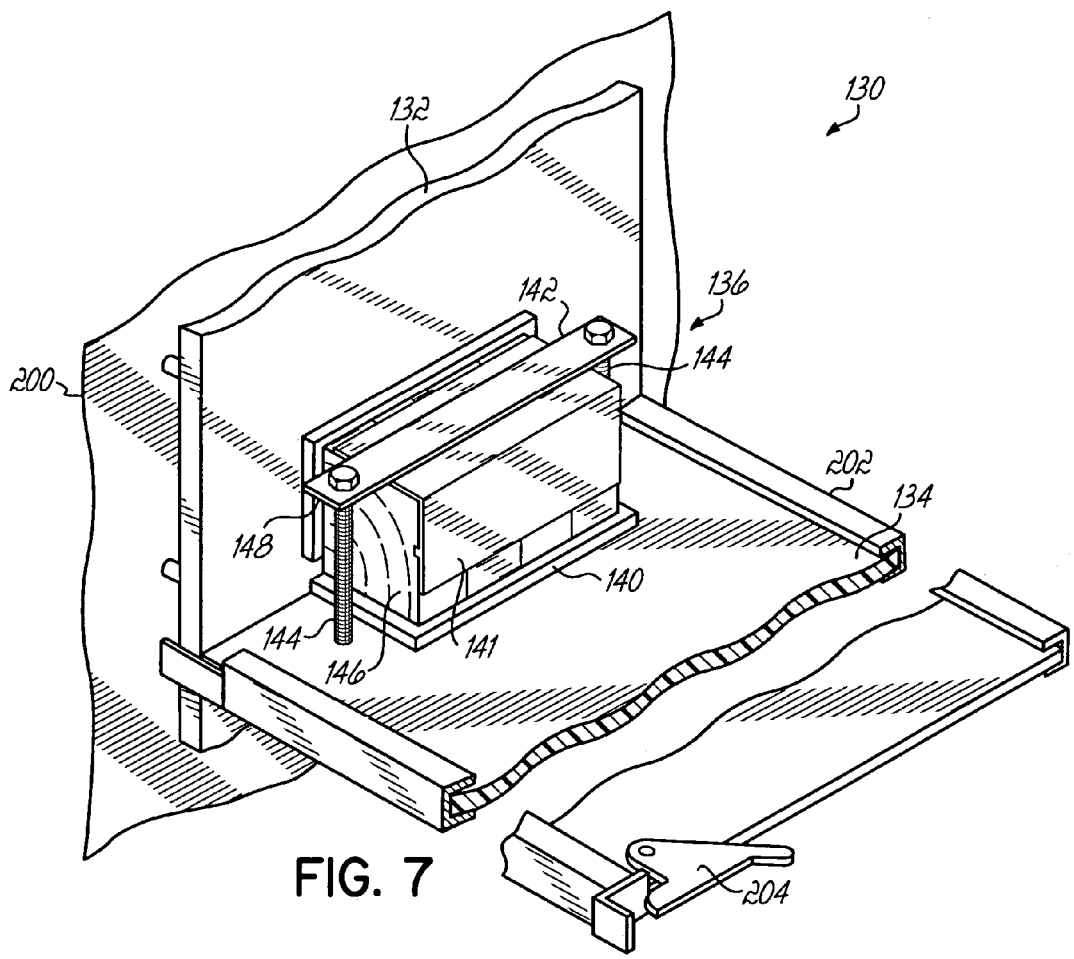
FIG. 7 is perspective view of an embodiment of a connector assembly between two substantially orthogonal circuit boards in accordance with principles of the present invention.

Referring now to FIG. 7, a perspective view of connector assembly 130 between two substantially orthogonal components, such as circuit boards 132, 134 is shown. Connector assembly 130 comprises two substantially orthogonal circuit boards 132, 134, a signal array 136 including at least one shielded conductor 146 (shown in phantom line), and compressible interface elements 138, 140 coupled between each circuit board 132, 134 and shielded conductor 146. Compressible interface elements 138, 140 may be elastomeric connectors, as generally described herein above, and more specifically described in conjunction with FIGS. 2 and 5.

Shielded conductor 146 may, for example, be lengths of semi-rigid coax or twinax, including one or two axial conductive elements, respectively, and a conductive outer structure. Examples of signal arrays including shielded conductors with one and two axial conductive elements will be described in FIGS. 8 and 9, respectively. Those skilled in the art will appreciate that shielded conductors containing more than two axial conductive elements may also used for high speed data and/or communications signals and that such a use does not constitute a departure from the spirit of the present invention.

Figure 8:
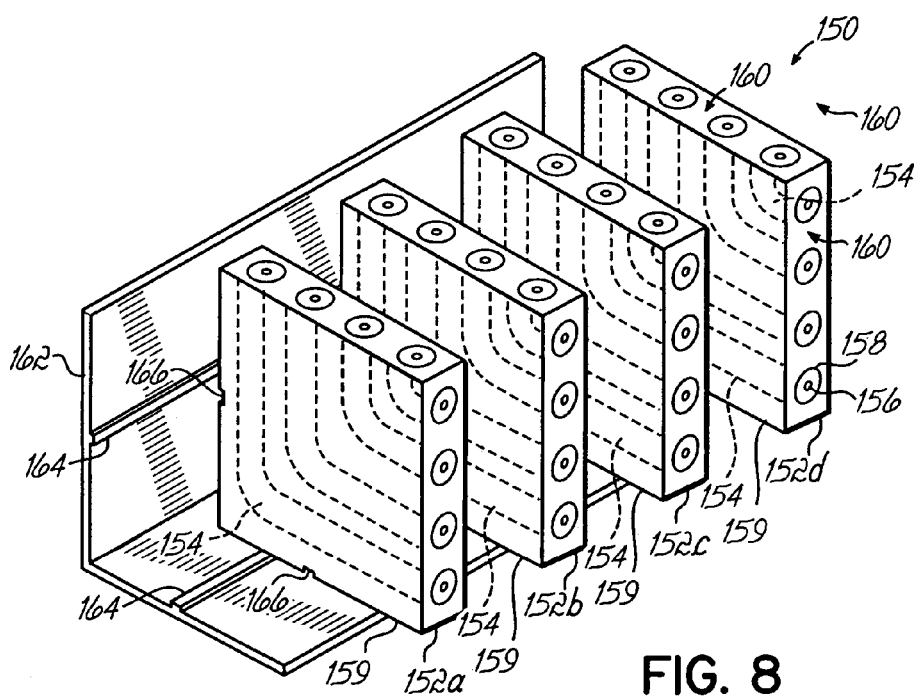
FIG. 8 is an exploded perspective view of a signal array in accordance with principles of the present invention including coaxial conductors.

For example, in one embodiment, circuit boards 132, 134 include at least one pair of corresponding land areas including one central conductive core area. Examples of corresponding lands areas including one central conductive core area located on circuit boards were shown in FIGS. 1 and 2, and the formation of such land areas were described in conjunction with connector assembly 10. FIG. 8 shows a signal array for use with circuit boards 132, 134 when circuit boards 132, 134 include at least one pair of corresponding land areas having one central conductive core area.

Figure 9:
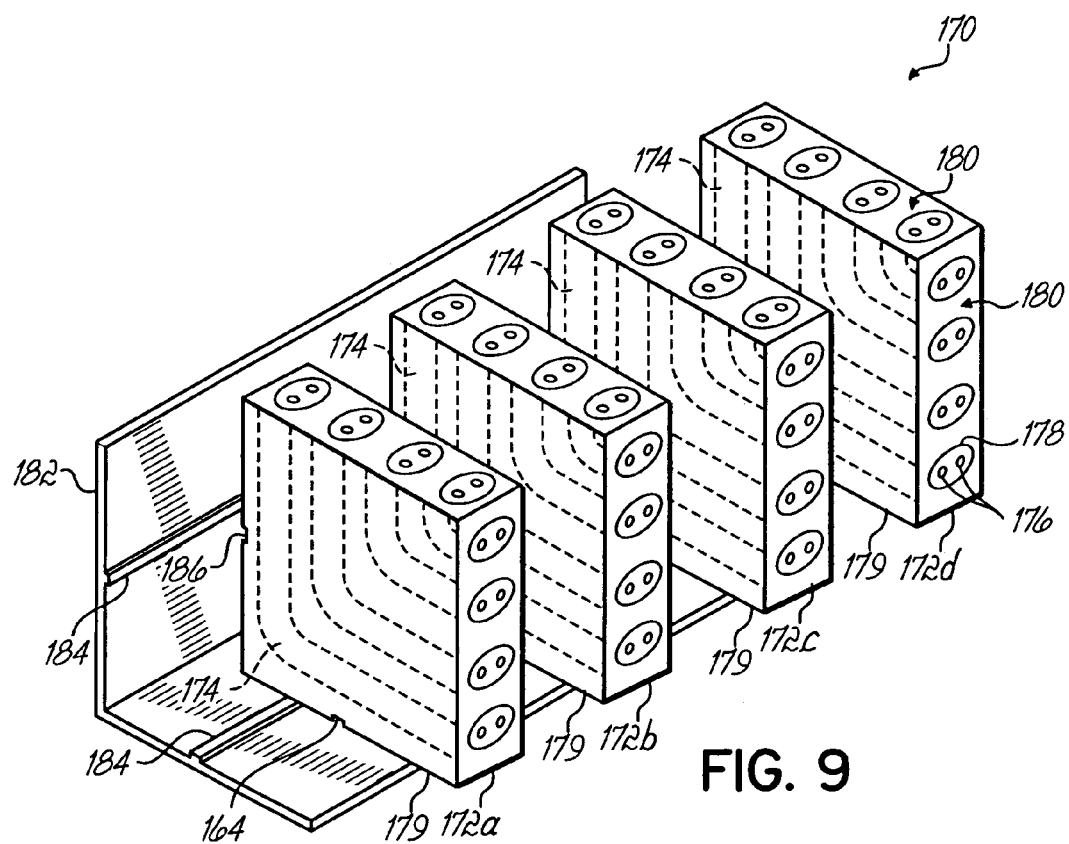
FIG. 9 is an exploded perspective view of a signal array in accordance with principles of the present invention including twinaxial conductors.

In another embodiment, circuit boards 132, 134 include at least one pair of corresponding land areas including two central conductive core areas. Examples of corresponding land areas including two central conductive core areas located on circuit boards were shown in FIGS. 4 and 5, and described in conjunction with connector assembly 70. FIG. 9 shows a signal array for use with circuit boards 132, 134 when circuit boards 132, 134 include at least one pair of corresponding land areas having two central conductive core areas.

With the benefit of the foregoing and, more specifically, connectors assemblies 10 and 70, shown, in FIGS. 1–3 and 4–6, respectively, those of ordinary skill in the art will readily appreciate the formation of land areas including one or two central conductive core areas on circuit boards 132, 134. Moreover, and although not shown, it will be appreciated that land areas including one or two central conductive core areas on circuit boards 132, 134 extend to traces on multiple layers of circuit boards 132, 134, and to any electrical components soldered to those traces. Such traces with electrical components soldered thereto form circuits on circuit boards 132, 134.

Still referring to FIG. 7, circuit boards 132, 134 may be a backplane and a circuit pack, respectively. In such an embodiment, circuit board 132 may include primarily traces to interconnect numerous circuit packs using multiple connector assemblies described herein, and few, if any, electrical components. Circuit board 134, as well as other similar circuit boards, may include numerous electrical components configured to perform some functionality, and also include connector assemblies described herein.

Circuit boards 132, 134 may also be a motherboard and a daughter card, respectively. In such an embodiment, circuit board 132 may include a processor, e.g., microprocessor, and traces to interconnect numerous circuit packs using multiple connector assemblies described herein. Circuit board 134, as well as other similar circuit boards, may include numerous electrical components configured to preform some function, and also include connector assemblies described herein.

Other embodiments or applications which lend themselves to two substantially perpendicular circuit boards will readily appear to those of skill in the art.

Referring now to FIG. 8, an exploded perspective view of signal array 150 for use with circuit boards 132, 134, when circuit boards 132, 134 include land areas having one central conductive core area, is shown. Signal array 150 comprises four blocks 152a–d, each including four shielded conductors 154 (shown in phantom line) formed to extend at approximately 90 degree angles or have 90 degree bends. Each shielded conductor 154 includes an axial conductive element 156 and an outer conductive element 158. Shielded conductors 154 may be formed from semi-rigid coax well know to those of skill in the art.

Each block 152a–d may be constructed by forming pieces of semi-rigid coax at approximately 90 degree angles and casting or molding the coax into a non-conductive substance, such as a LCP 159. The contact surfaces 160 may then be machined to improve the co-planarity of the shielded conductors 154 and the interface between the shielded conductors 154 and the compressible interface elements, such as compressible interface elements 138, 140 shown in FIG. 7.

In some embodiments, signal array 150 may further comprise a clip or band 162. Clip 162 includes ribs 164, while blocks 152a–d include notches 166, corresponding to ribs 166. Clip 162 functions to holds blocks 152a–d together, and aligned, when pressure is applied to signal array 150, such as, for example, clip 141 does when pressure is applied to signal array 136 shown in FIG. 7.

Referring now to FIG. 9, an exploded perspective view of signal array 170 for use with circuit boards 132, 134, when circuit boards 132, 134 include land areas having two central conductive core areas, is shown. Signal array 170 also comprises four blocks 172a–d, each including four shielded conductors 174 (shown in phantom line) formed at approximately 90 degree angles or having 90 degree bends. Each shielded conductor 174 includes two axial conductive elements 176 and an outer conductive element 178. Shielded conductors 178 may be formed from semi-rigid twinax well know to those of skill in the art.

Each block 172a–d may be constructed by forming pieces of semi-rigid twinax at approximately 90 degree angles and casting or molding the twinax into a non-conductive substance, such as LCP 179. The contact surfaces 180 may then be machined to improve the co-planarity of the shielded conductors 174 and the interface between the shielded conductors 174 and compressible interface elements, such as compressible interface elements 138, 140 shown in FIG. 7.

In some embodiments, signal array 170 may also comprise a clip or band 182. Clip 182 includes ribs 184, while blocks 172a–d include corresponding notches 186. Clip 182 functions to holds blocks 172a–d in alignment when pressure is applied to signal array 170, such as pressure is applied to signal array 136 shown in FIG. 7, such as, for example, clip 141 does when pressure is applied to signal array 136 shown in FIG. 7.

Those skilled in the art will appreciate that although signal arrays 150, 170 are constructed as blocks 152a–d, 172a–d, respectively, other embodiments of the present invention may be built using similarly functioning signal arrays having wafer type construction. An example of wafer type construction was shown in FIGS. 4–6 and described in conjunction with signal array 76.

Those skilled in the art will also appreciate that a signal array, irrespective of the type of shield conductor used, may be constructed having any size desired. Thus, for example, a signal array need not be constructed having a four-by-four array as shown herein in FIGS. 1–9. Rather, those skilled in the art will readily size or scale the number of conductors in a signal array to meet various circuit requirements and the need to couple high frequency data and/or communications signals between two circuit boards.

Referring once again to FIG. 7, in use, compressible interface element 140 is placed between corresponding shielded land areas, e.g., coaxial or twinaxial, on circuit board 134 and shielded conductors 146 in signal array 136, aligning the central conductive core areas and the conductive outer structure areas of the land areas on circuit board 134 with the axial conductive element(s) and the conductive outer element of shielded conductors 146, respectively. Pressure is applied to compressible interface element 140 to compress the compressible interface element 140 such that the conductive elements within compressible interface element 140 provide electrical connection from land areas on circuit board 134 through the conductive elements to shielded conductors 146.

Pressure may be applied using a variety of fasteners. For example, and as shown in FIG. 7, connector assembly 130 further comprises bolts 144 extending through cross member 148 and circuit board 134 with nuts (not shown) that used to compress, or apply pressure to, compressible interface element 140 coupled between circuit board 134 and signal array 136. Other fasteners may used in the alternative.

Likewise, connector 138 is placed between corresponding land areas, e.g., coaxial or twinaxial, on circuit board 132 and shielded conductors 146 in signal array 136, aligning the central conductive core areas and the conductive outer structure areas of the land areas on circuit board 132 with the axial conductive element(s) and the outer conductive element of shielded conductors 146, respectively.

Such alignment may be achieved in a variety of ways. For example, and as also shown in FIG. 7, circuit board 132 may be mounted in a fixed location, such as to frame or enclosure 200. In such an example, circuit board 134 may be referred to as a backplane or a mother board. Frame or enclosure 200 includes guides or slides 202 for receiving circuit boards, such as circuit board 134. Additional slides may be included for other circuit boards. Circuit board 134 is inserted into guides or slides 202 such that circuit boards 132, 134 are substantially orthogonal.

Pressure is also applied to compressible interface element 138 to compress compressible interface element 138 such that the conductive elements within compressible interface element 138 provide electrical connection from land areas on circuit board 132 through the conductive elements to shielded conductors 146. Such pressure may be provided by latch 204 mounted to circuit board 134, that articulates and engages slide 202, applying pressure to compressible interface element 138.

When compressible interface elements 138, 140 are compressed, those conductive elements contacting the outer conductive elements of shield conductors 146 and the conductive outer structure areas of land areas on circuit boards 132, 134 form a shield around, or "shield", those conductive elements contacting the axial conductive elements of shield conductors 146 and the central conductive core areas of the land areas on circuit boards 132, 134. Thus, when compressible interface elements 138, 140 are compressed, conductive elements of compressible interface elements 138, 140 "extend" the geometric arrangement and/or shielding of shield conductors 146 through to land areas, or the surface, of circuit boards 132, 134.

Shielded conductors 146 accompanied by compressible interface elements 138, 140 that extended the shielding of those conductors may be used for single ended or differential signals, based on the number of axial conductive element in a shielded conductor, such as high speed data and/or communications signals. Shielding is particularly useful in preventing interference when using such high speed or high frequency signals. Moreover, shielding prevents "crosstalk" between shielded conductors placed in close proximity with one another, and facilies the construction of dense or tightly spaced arrays of shielded conductors.

In addition, connector assembly 130 capitalizes on the benefits of elastomeric connectors, e.g., compressible interface elements 138, 140, in providing high frequency data and/or communications connections between circuit boards 132, 134. In doing so, connector assembly 130 requires no soldering. Further, no soldering or special skill is required to remove and replace one of the compressible interface elements 138, 140 or the signal array 136. A user need only release latch 204, remove circuit board 134 from slides 202 and frame 200, and/or remove fasteners 144, reposition the new compressible interface elements 138, 140 and/or signal array 136, and reinstall the fasteners 144 and circuit board 134. Also, connector assembly 130 includes no pins that may be bent or broken in inserting circuit board 134 in slides 202, resulting in a failure of the product the circuit boards 132, 134 are included in, either under production test or in the possession of a user or consumer. Connector assembly 130 also extends the geometric arrangement of the shielded conductors 146 in signal array 136 through connector assembly 130 to the surface of the circuit boards 132, 134. By extending the geometric arrangement, with its inherent shielding, crosstalk between shield conductors in the array is reduced, while the variation in impedance with changes in frequency of each respective shielded conductor 18 is also reduced. Thus, connector assembly 130 improves the replacement and serviceability of high speed data and/or communications connections.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details of representative apparatus and method, and illustrative examples shown and described. Accordingly, departures may be made from such details without departure from the spirit or scope of applicant's general inventive concept.

What is claimed is:

1. A connector comprising:
a signal array having a plurality of shielded conductors with opposite ends, each shielded conductor including an axial conductive element and an outer conductive element completely surrounding the axial conductive element;
the plurality of shielded conductors arranged in a body structure so that the inner and outer conductive elements are electrically presented at a contact face surface of the body structure in a generally co-planar arrangement wherein the generally co-planar arrangement is generally co-planar with the contact face surface of the body structure
a compressible interface element positioned at the contact face surface of the body structure of the signal array, the interface element including a layer of insulating material having a plurality of conductive elements extending through the insulating material layer;
the compressible interface element, when compressed between the contact face surface of the body structure and a signal bearing component, maintaining, through the interface element, the geometric arrangements of the axial conductive elements and the completely surrounding outer conductive elements of the shielded conductors presented at the contact face surface of the body structure, to pass signals with the signal bearing component.

2. The connector of claim 1 wherein the at least one shielded conductor includes length of semi-rigid coax.

3. The connector of claim 1 wherein at least one shielded conductor includes a length semi-rigid twinax.

4. The connector of claim 1 further comprising a fastener used to compress the compressible interface element to maintain the geometric arrangement of the axial conductive element and the surrounding outer conductive element through the interface element.

5. The connector of claim 1 further comprising:
a signal bearing component including a plurality of land areas;
the land areas configured for coupling with axial conductive elements and the outer conductive elements of respective shielded conductors of the signal array.

6. The connector of claim 1 further comprising:
the other ends of the shielded conductors presented at an opposing contact face surface of the body structure;
a second compressible interface element positioned at the opposing contact face surface of the signal array, the second interface element including a layer of insulating material having a plurality of conductive elements extending through the insulating material layer;
the second compressible interface element, when compressed between the signal array and a second signal bearing component, maintaining, through the interface element, the geometric arrangements of the axial conductive element and the surrounding outer conductive element of the shielded conductors, presented at the opposing contact face surface of the array, to pass a signal with the second signal bearing component.

7. The connector of claim 6 wherein the first signal bearing component is a circuit board including at least one land area;
the land area configured for coupling with the axial conductive element and the surrounding outer conductive element of the shield conductor.

8. The connector of claim 7 wherein the second signal bearing component is a circuit board including at least one land area;
the land area configured for coupling with the axial conductive element and the surrounding outer conductive element of the shield conductor;
the land areas on the first and second circuit boards corresponding.

9. The connector of claim 8 wherein the first and second circuit boards are substantially parallel.

10. The connector of claim 8 wherein the circuit boards are substantially orthogonal.

11. The connector of claim 10 further comprising at least one fastener to compress the first compressible interface element between the first circuit board and the signal array.

12. The connector of claim 11 further comprising a latch coupled to the first circuit board and configured to press the signal array against the second circuit board compressing the second compressible interface element.

13. The connector of claim 1 wherein the multiple shielded conductors are molded into the body structure.

14. The connector of claim 13 wherein a contact surface of the body structure is machined.

15. The connector of claim 13 wherein a guide pin is molded into the body structure, the guide pin configured to aid in alignment of the shielded land areas and the respective shielded conductor.

16. A connector comprising:
a signal array having a plurality of shielded conductors, each including an axial conductive element and an outer conductive element surrounding the axial conductive element;
a compressible interface element positioned at a contact face surface of the body structure of the signal array, the interface element including a layer of insulating material having a plurality of conductive elements extending through the insulating material layer;
the compressible interface element, when compressed between the contact face surface and a signal bearing component, maintaining the geometric arrangements of the axial conductive elements and the outer conductive elements with the signal bearing component;
the multiple shielded conductors molded into a body structure formed of multiple blocks;
a clip configured to hold the multiple blocks in alignment under pressure.

17. The connector of claim 1 wherein the multiple shielded conductors are coupled to at least one wafer.

18. A connector comprising:
a signal array having a plurality of shielded conductors having opposite ends and including an axial conductive element and an outer conductive element surrounding the axial conductive element;
a compressible interface element positioned at least one of the opposite ends of the signal array, the interface element including a layer of insulating material having a plurality of conductive elements extending through the insulating material layer;

wherein the plurality of shielded conductors are molded to multiple wafers forming mounting ends on each wafer;

the compressible interface element, when compressed between the signal array and a signal bearing component, maintaining the geometric arrangement of the axial conductive element and the outer conductive element to the signal bearing component.

19. The connector of claim 18 wherein a contact surface of the mounting ends is machined.

20. The connector of claim 18 wherein a guide pin is molded into one of the mounting ends, the guide pin configured to aid in alignment of the shielded land area and the axial conductive element and the outer conductive element of the shield conductor connector.

21. The connector of claim 1 wherein the compressible interface element is constructed of silicon rubber with anisotropic conductive properties.

22. The connector of claim 1 wherein the conductive elements of the compressible interface element are 300 to 2,000 fine metal wires per square centimeter.

23. The connector of claim 22 wherein the fine metal wires are gold-plated to ensure low resistivity and the ability to withstand relatively high current flow.

24. The connector of claim 1 wherein the signal-bearing component is a circuit board.

* * * * *